United States Patent
Mimuro et al.

(10) Patent No.: US 10,586,776 B2
(45) Date of Patent: *Mar. 10, 2020

(54) SEMICONDUCTOR DEVICE AND METHOD OF MANUFACTURING THE SAME

(71) Applicant: ABLIC Inc., Chiba-shi, Chiba (JP)

(72) Inventors: Yoichi Mimuro, Chiba (JP); Shinjiro Kato, Chiba (JP); Tetsuo Shioura, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/906,477

(22) Filed: Feb. 27, 2018

(65) Prior Publication Data

US 2018/0261562 A1    Sep. 13, 2018

(30) Foreign Application Priority Data

Mar. 7, 2017  (JP) .................. 2017-043156

(51) Int. Cl.
*H01L 23/00* (2006.01)
*H01L 21/02* (2006.01)
(Continued)

(52) U.S. Cl.
CPC .......... *H01L 24/05* (2013.01); *H01L 21/0214* (2013.01); *H01L 21/0217* (2013.01); *H01L 21/02266* (2013.01); *H01L 21/31105* (2013.01); *H01L 21/78* (2013.01); *H01L 23/291* (2013.01); *H01L 23/3171* (2013.01); *H01L 23/3192* (2013.01); *H01L 24/03* (2013.01); *H01L 24/94* (2013.01); *H01L 21/02057* (2013.01); *H01L 21/02271* (2013.01); *H01L 21/31116* (2013.01); *H01L 2224/02215* (2013.01); *H01L 2224/03011* (2013.01); *H01L 2224/03019* (2013.01); *H01L 2224/0382* (2013.01); *H01L 2224/0391* (2013.01); *H01L 2224/03826* (2013.01); *H01L 2224/04042* (2013.01); *H01L 2224/05022* (2013.01); *H01L 2224/05548* (2013.01); *H01L 2224/05624* (2013.01); *H01L 2224/45139* (2013.01); *H01L 2224/45144* (2013.01);
(Continued)

(58) Field of Classification Search
None
See application file for complete search history.

(56) References Cited

U.S. PATENT DOCUMENTS

2012/0211879 A1* 8/2012 Watanabe ......... H01L 27/14683
257/734
2013/0069785 A1* 3/2013 Subramanian ....... G08B 13/242
340/572.3

FOREIGN PATENT DOCUMENTS

JP         2012-174951 A    9/2012

* cited by examiner

*Primary Examiner* — Long Pham
(74) *Attorney, Agent, or Firm* — Brinks Gilson & Lione (57) ABSTRACT

A semiconductor device includes a substrate; a laminate which is formed on one main surface side of the substrate, and includes an aluminum alloy wiring and an insulating film surrounding the aluminum alloy wiring; and a silicon nitride film covering the laminate, in which the silicon nitride film and the insulating film have an opening portion, through which the silicon nitride film and the insulating film, formed at a position overlapped with a bonding portion of the aluminum alloy wiring, and a deposition made of a residue caused by reverse sputtering, which contains silicon and nitrogen, adheres to a portion exposed from the opening portion of a surface of the aluminum alloy wiring, to form a film.

17 Claims, 10 Drawing Sheets

(51) Int. Cl.
*H01L 23/31* (2006.01)
*H01L 21/78* (2006.01)
*H01L 23/29* (2006.01)
*H01L 21/311* (2006.01)

(52) U.S. Cl.
CPC ............... *H01L 2224/45147* (2013.01); *H01L 2224/85205* (2013.01); *H01L 2224/85375* (2013.01); *H01L 2924/04941* (2013.01); *H01L 2924/05042* (2013.01)

SEMICONDUCTOR DEVICE AND METHOD OF MANUFACTURING THE SAME

RELATED APPLICATIONS

This application claims priority under 35 U.S.C. § 119 to Japanese Patent Application No. 2017-043156 filed on Mar. 7, 2017, the entire content of which is hereby incorporated by reference.

BACKGROUND OF THE INVENTION

1. Field of the Invention

The present invention relates to a semiconductor device and a method of manufacturing the semiconductor device.

2. Description of the Related Art

An integrated circuit (IC) formed on a semiconductor wafer is used after separation of die from the wafer (cut into chips) by blade dicing. In order to cool the blade for dicing and remove debris generated by the dicing, blade dicing is usually performed while water, which is generally pure water whose resistivity is under control, is sprayed to the blade and its periphery.

When the sprayed water adheres to a bonding pad made of an aluminum alloy (alloy of aluminum and copper, for example), galvanic corrosion occurs between that water and the aluminum alloy. As a result, pores are generated in aluminum portions in the bonding pad, and a contact area with metal of a wiring side (gold, silver, or copper) reduces at the time when wire bonding is performed. Consequently, strength of the wire bonding deteriorates.

On a surface of the bonding pad made of the aluminum alloy, an alumina film is formed when the bonding pad is exposed to the air. However, when dicing is performed for a long time to obtain small chips, it is difficult to sufficiently prevent the galvanic corrosion by a thickness of the alumina film. The alumina film can be thickened by heat treatment, but the thickened alumina film cannot be completely broken by ultrasonic waves at the wire bonding and remains on the bonding pad. Consequently, there arises a problem in that the bonding cannot be completed.

Further, there is a problem in that, in a long-term reliability test (temperature humidity bias test (THB)) under a high humidity environment, water having reached the bonding pad, to which a positive potential is supplied, corrodes an antireflective film (TiN film) that is made of TiN and formed around the bonding pad. This is because the alumina film is generated only on a surface of the aluminum alloy, and therefore cannot cover a surface of the TiN film. In order to achieve an IC product having high reliability, there is desired a technology of preventing the aluminum alloy and the TiN film being the antireflective film from being exposed to water that is generated when the dicing or the long-term reliability test is performed.

SUMMARY OF THE INVENTION

The present invention has been made in view of the above-mentioned circumstance, and it is an object of the present invention to provide a semiconductor device that is capable of suppressing corrosion (galvanic corrosion) caused by water of a part of an aluminum alloy wiring which is exposed as a bonding pad, and a method of manufacturing the semiconductor device.

In order to solve the above-mentioned problems, the present invention adopts the following measures.

(1) According to one embodiment of the present invention, there is provided a semiconductor device including: a substrate; a laminate which is formed on one main surface side of the substrate, and which includes an aluminum alloy wiring and an insulating film surrounding the aluminum alloy wiring; a silicon nitride film covering the laminate; an opening portion formed through the silicon nitride film and the insulating film to have a substantially constant size, formed at a position overlapped with a pad portion of the aluminum alloy wiring; and a deposition made of a residue caused by reverse sputtering, and containing silicon and nitrogen, the deposition adhering to a surface of the pad portion which is exposed from the opening portion, to form a film.

(2) According to one or more embodiments, in the semiconductor device as described in Item (1), the film contains silicon and nitrogen at a ratio of 50% or more and 70% or less and a ratio of 5% or more and 25% or less, respectively.

(3) According to one or more embodiments, in the semiconductor device as described in Item (1), the film further contains oxygen.

(4) According to one or more embodiments, in the semiconductor device as described in Item (1), the film is also formed on an inner wall of the opening portion.

(5) According to one or more embodiments, in the semiconductor device as described in Item (1), a titanium nitride film can be formed in a periphery of a portion exposed from the opening portion of a surface of the aluminum alloy wiring.

(6) According to one or more embodiments, in the semiconductor device as described in Item (1), the film has a thickness of 100 Å or more and 200 Å or less.

(7) According to one embodiment of the present invention, there is provided a method of manufacturing the semiconductor device of Item (1), including performing plasma processing using inert gas with respect to the silicon nitride film after the opening portion is formed.

(8) According to one or more embodiments, in the method of manufacturing the semiconductor device described in Item (7), argon gas is used as the inert gas.

(9) According to one or more embodiments, in the method of manufacturing the semiconductor device as described in Item (7), time for the plasma processing is set to 30 seconds or more and 120 seconds or less.

In the semiconductor device of the present invention, the deposition made of the residue caused by reverse sputtering, which contains silicon and nitrogen, adheres to a portion of the aluminum alloy wiring which is exposed as the bonding pad, to form the film. This film serves as a protective film having water resistance, and hence corrosion (galvanic corrosion) caused by water that is sprayed during blade dicing, for example, can be suppressed. Accordingly, in the semiconductor device of the present invention, it is possible to prevent a defect in the aluminum alloy wiring due to the corrosion and enable the aluminum alloy wiring to be bonded with improved bonding strength.

DETAILED DESCRIPTION OF THE EMBODIMENTS

Now, the present invention is described in detail with reference to the drawings as appropriate. In the drawings used in the description below, in order to facilitate understanding of features of the present invention, characteristic parts may be shown in an enlarged manner for convenience of the description, and a dimensional ratio and the like of each component may be different from actual ones. Further, the materials, dimensions, and the like exemplified in the following description are merely examples, and the present invention is not limited thereto. Modifications can be made as appropriate within a range of exerting effects of the present invention.

First Embodiment

[Structure of Semiconductor Device]

Figure 1:
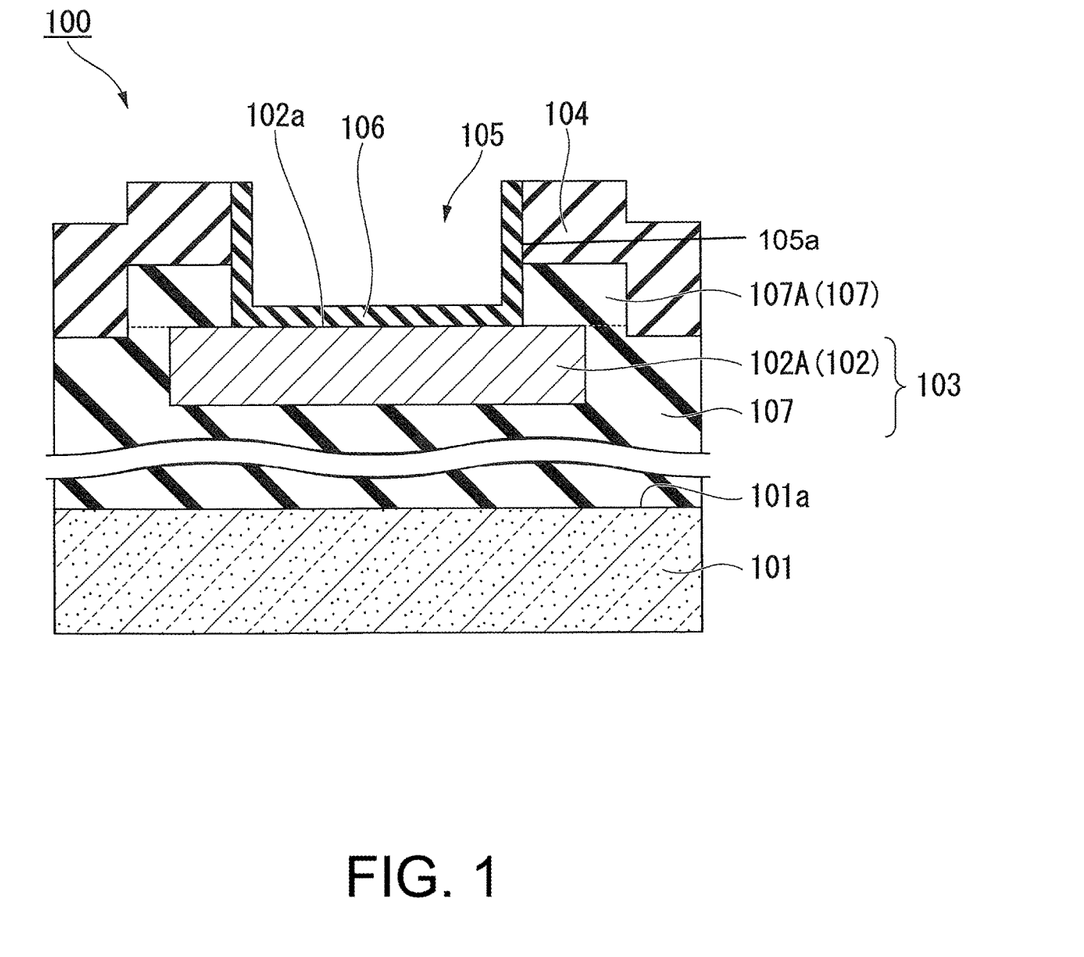
FIG. 1 is a cross-sectional view of a semiconductor device according to a first embodiment of the present invention.

FIG. 1 is a cross-sectional view of a semiconductor device 100 according to a first embodiment of the present invention. The semiconductor device 100 includes: a substrate 101 made of silicon, for example; a laminate 103 which is formed on one main surface 101a side of the substrate 101, and includes an aluminum alloy (alloy of aluminum and copper, for example) wiring 102 and an insulating film (interlayer film or interlayer insulating film) 107 surrounding the aluminum alloy wiring 102; and a silicon nitride film 104 covering the laminate 103.

In FIG. 1, only the aluminum alloy wiring 102 located at the uppermost layer is clearly shown as wiring (layer) included in the laminate 103. However, in addition to the aluminum alloy wiring 102, other pieces of wiring that have various shapes and are made of various materials in accordance with a purpose may be included in the laminate 103. Further, in addition to the wiring, layers that have various functions in accordance with a purpose may be included in the laminate 103.

The insulating film 107 is formed between the layers constructing the laminate 103 and between the layers and the substrate 101. Specific examples of the insulating film 107 include an oxide film, an oxynitride film, and SOG that are made of a material, for example, $SiO_2$ or tetraethyl orthosilicate (TEOS ($Si(OC_2H_5)_4$)).

The silicon nitride film 104 is a film that is formed by a CVD method, and includes silicon, nitrogen, and hydrogen at a ratio of about 40%, about 50%, and about 10%, respectively. It is preferred that the silicon nitride film 104 have a thickness of 7,000 Å or more and 15,000 Å or less.

In the silicon nitride film 104 and the insulating film 107 which are located on the aluminum alloy wiring 102, an opening portion (pad opening portion) 105 is formed through the silicon nitride film 104 and the insulating film 107 to have a substantially constant size at a pad portion 102A of the aluminum alloy wiring 102, that is, a position overlapped with a portion that is to serve as a wire bonding pad.

A deposition made of a residue caused by reverse sputtering, which contains silicon and nitrogen as main components, adheres (readheres) to a surface 102a of the pad portion 102A of the surface of the aluminum alloy wiring 102, which is exposed from the opening portion 105, and thus a film 106 made of this deposition is formed. The film 106 can be formed by performing plasma processing using inert gas with respect to the silicon nitride film 104. Plasma of the inert gas collides against the silicon nitride film 104, and thus the silicon nitride film 104 is subjected to reverse sputtering to generate removed substances by etching. The residue caused by reverse sputtering being the removed substances generated from the silicon nitride film 104 by the etching readheres to the surface 102a of the aluminum alloy wiring 102 and is deposited thereon, with the result that the film 106 is formed. The film 106 has an excellent water resistance.

It is preferred that the film 106 contains silicon at a ratio of 50% or more and 70% or less, and nitrogen at a ratio of 5% or more and 25% or less, respectively.

The film 106 may further contain oxygen at a ratio of 15% or more and 35% or less. That oxygen is derived mainly from an alumina ($Al_2O_3$) film formed on the exposed portion of the surface 102a of the aluminum alloy wiring 102 through exposure to the air.

It is more preferred that the film 106 be formed not only on the exposed portion of the surface 102a of the aluminum alloy wiring 102 but also on inner walls of the opening portion 105 as illustrated in FIG. 1 because this configuration prevents water from entering the interface between the aluminum alloy wiring 102 and the insulating film 107.

In view of the prevention of the penetration of water through the interface, the film 106 only needs to cover the interface, that is, a periphery of bottom end portions of the inner walls of the opening portion 105, and may not be formed up to upper end portions of the inner walls 105a of the opening portion 105.

It is preferred that the film 106 formed on the surface 102a of the pad portion 102A of the aluminum alloy wiring 102 have a thickness of 100 Å or more and 200 Å or less. The penetration of water into the aluminum alloy wiring 102 can be almost completely prevented by forming the film 106 so that its thickness is 100 Å or more. Further, the film 106 may easily be broken by ultrasonic waves when its thickness is 200 Å or less. Accordingly, it is possible to satisfactorily perform bonding of wiring metal to the aluminum alloy wiring 102 and secure a high yield of bonding and high reliability.

As described above, in the semiconductor device 100 according to the first embodiment, the deposition made of the residue caused by reverse sputtering, which contains silicon and nitrogen, adheres to a portion of the aluminum alloy wiring 102 which is exposed as the bonding pad, to form the film 106. This film 106 serves as a protective film having water resistance, and hence corrosion (galvanic corrosion) caused by water that is sprayed during blade dicing, for example, can be suppressed. Accordingly, in the semiconductor device 100 according to the first embodiment, it is possible to prevent a defect in the aluminum alloy wiring 102 due to the corrosion and enable the aluminum alloy wiring 102 to be bonded with improved bonding strength.

[Method of Manufacturing Semiconductor Device]

A method of manufacturing the semiconductor device 100 is described.

First, the laminate 103 having a desired structure is formed on the one main surface 101a of the substrate 101 made of silicon, for example. Each layer constructing the laminate 103 can be formed by repeatedly performing, as appropriate, film formation using a publicly-known method, for example, the CVD method or a sputtering method, and patterning using a photolithography method. Subsequently, the silicon nitride film 104 is formed on the laminate 103 with use of a plasma CVD method.

Next, the opening portion (pad opening portion) 105 is formed through the insulating film 107 and the silicon nitride film 104, which have been formed at this time, so that a portion of the surface 102a of the pad portion 102A, which is subjected to the wire bonding, of the surface of the aluminum alloy wiring 102 is exposed.

Figure 2:
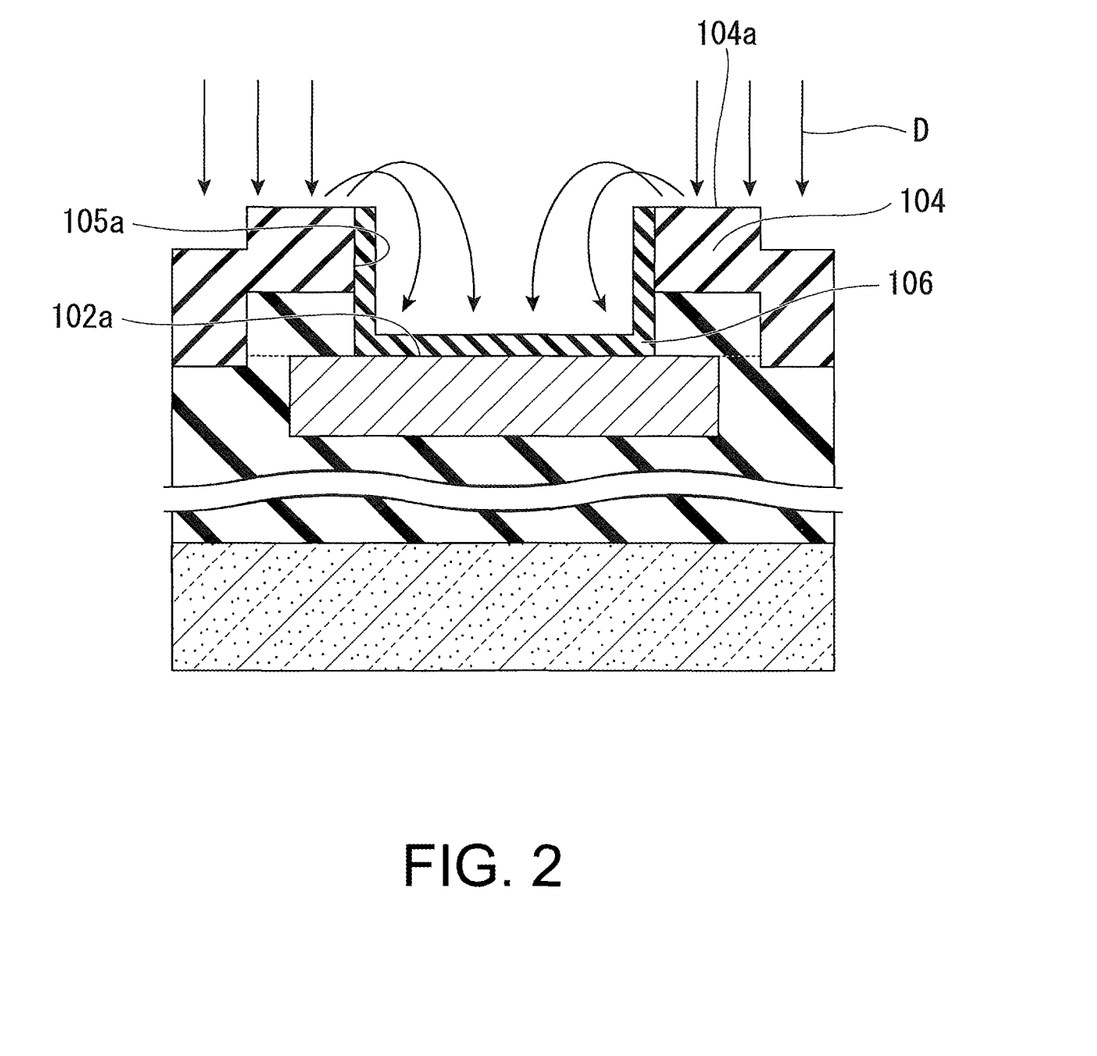
FIG. 2 is a view for illustrating a main process of a method of manufacturing the semiconductor device according to the first embodiment of the present invention.

Next, with use of a reactive ion etching (RIE) method, the plasma processing (plasma etching) is performed with respect to the silicon nitride film 104. Specifically, an inert gas D introduced into a reaction chamber is turned into plasma, and the plasma is caused to collide against a surface 104a of the silicon nitride film 104, with the result that a part of the surface 104a is etched, as illustrated in FIG. 2. The removed substances generated by the etching readheres to the exposed surface 102a of the pad portion (bonding pad) 102A of the aluminum alloy wiring 102 and to the inner walls (side walls of the pad) 105a of the opening portion 105. As a result, the film 106 is formed.

As the inert gas D, argon (Ar) or xenon (Xe) may be used, for example.

It is preferred that time for the plasma processing be 30 seconds or more and 120 seconds or less. Through setting of the time for the plasma processing in this range, the above-mentioned film 106 having an appropriate thickness can be formed.

It is preferred that pressure in the reaction chamber during the plasma processing be set to about 600 mTorr.

Second Embodiment

[Structure of Semiconductor Device]

Figure 3:
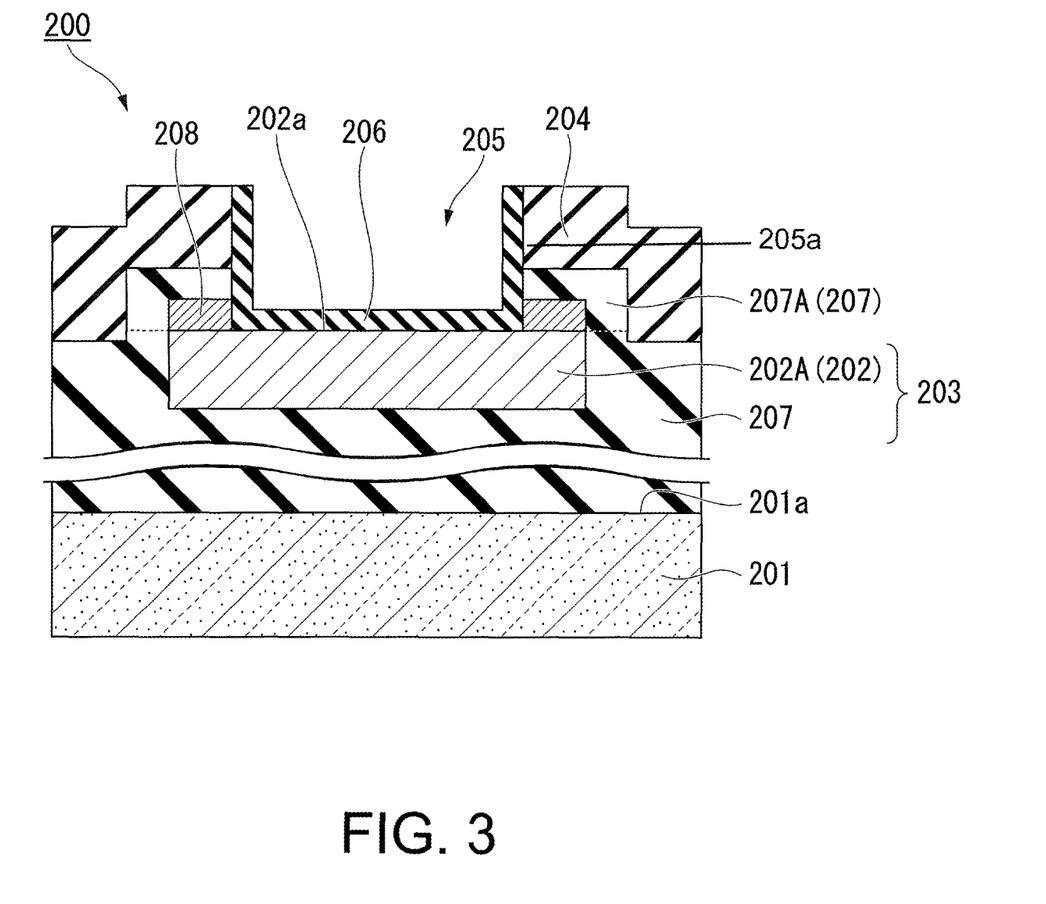
FIG. 3 is a cross-sectional view of a semiconductor device according to a second embodiment of the present invention.

FIG. 3 is a cross-sectional view of a semiconductor device 200 according to a second embodiment of the present invention. In the semiconductor device 200, a titanium nitride (TiN) film 208 is formed in the periphery of a portion exposed from an opening portion 205 of a surface 202a of a pad portion 202A formed of an aluminum alloy wiring 202. It is preferred that the titanium nitride film 208 have a thickness of 25 nm or more and 60 nm or less. The structure other than the titanium nitride film 208 is similar to that of the semiconductor device 100 according to the first embodiment, and the same effect as that of the semiconductor device 100 can be obtained.

In the semiconductor device 200, a deposition adheres to not only the surface of the aluminum alloy wiring 202 which is exposed from the opening portion 205, but also inner walls 205a of the opening portion 205 to form a film 206. Accordingly, a portion of the titanium nitride film 208 which is exposed from the opening portion 205 is covered by the film 206.

The titanium nitride film 208 serves as an antireflective film for suppressing reflection of light during patterning, and such a film is also used in a related-art semiconductor device. However, the titanium nitride film of the related-art semiconductor device is exposed at inner walls of an opening portion formed for wire bonding, and accordingly has a problem in that the titanium nitride film is corroded through adhesion of water under a high humidity environment, for example, in a long-term reliability test (temperature humidity bias test (THB)). In contrast, the semiconductor device 200 of the second embodiment has a structure in which the titanium nitride film 208 is not exposed, and hence can avoid the problem of the corrosion.

[Method of Manufacturing Semiconductor Device]

A method of manufacturing the semiconductor device 200 differs from the method of manufacturing the semiconductor device 100 according to the first embodiment in that the method involves forming the titanium nitride film 208 on the aluminum alloy wiring 202 located at the uppermost layer with use of a publicly-known method, for example, the CVD method. In the method of manufacturing the semiconductor device 200, the titanium nitride film 208 is removed together with an insulating film 207 and a silicon nitride film 204 at the position of the opening portion 205 when a pad opening is formed after the silicon nitride film 204 is formed. Processes other than the processes of forming and processing the titanium nitride film 208 are the same as those in the method of manufacturing the semiconductor device 100 according to the first embodiment.

EXAMPLES

Now, effects of the present invention are further clarified from the description of examples of the present invention. The present invention is not limited to the following examples, and modifications can be made thereto as appropriate within the range not changing the gist of the present invention.

[Composition Analysis of Pad Surface Portion]

Example 1

As Example 1 of the present invention, a composition analysis of a pad surface portion in a thickness direction thereof was performed with use of a sample of the semiconductor device 100 according to the first embodiment.

On the aluminum alloy wiring 102 being the uppermost layer, a silicone oxide film ($SiO_2$) 107A and the silicon nitride film (SiN) 104 were formed in the stated order so as to have a thickness of 2,000 Å and a thickness of 7,000 Å, respectively, and then a pad opening was formed. Plasma processing time with respect to the silicon nitride film 104 after formation of the pad opening was set to 60 seconds, and pressure in a reaction chamber during the plasma processing was set to about 600 mTorr.

Figure 4:
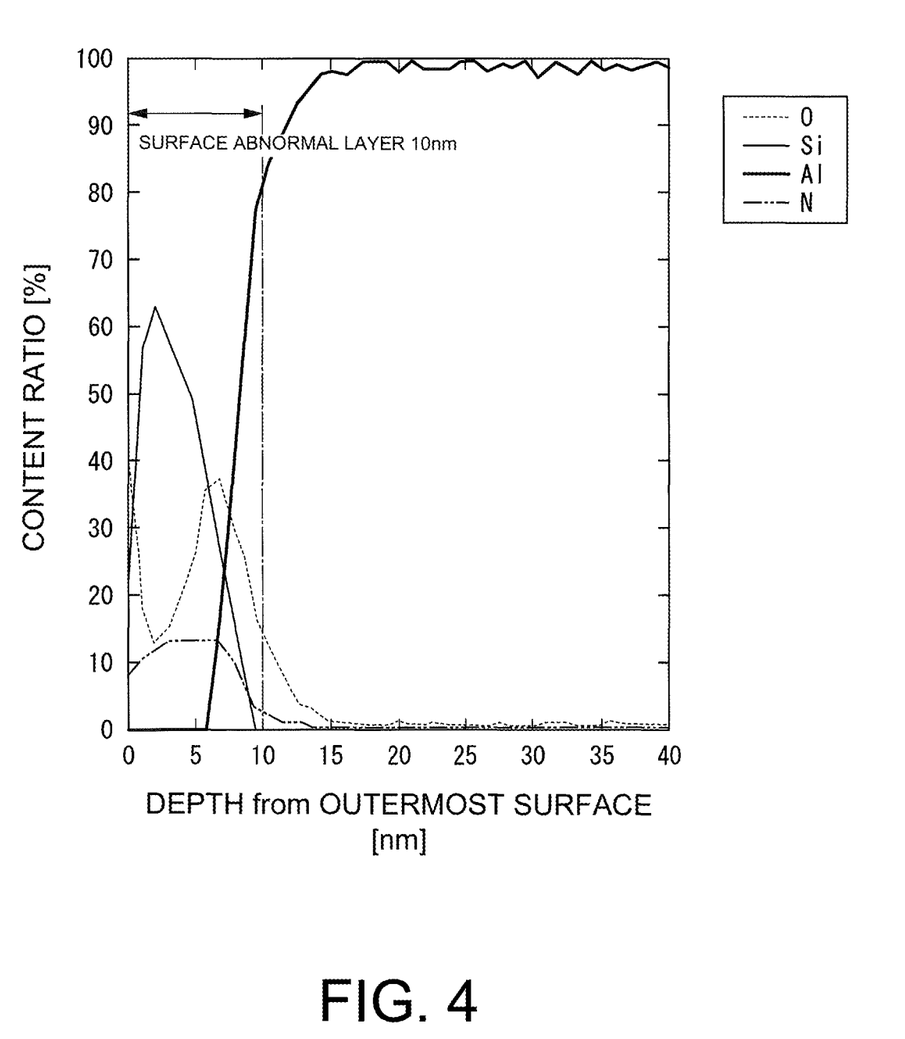
FIG. 4 is a graph for showing a composition analysis result of a pad surface portion of a semiconductor device of Example 1 of the present invention.

FIG. 4 is a graph for showing a composition analysis result. The horizontal axis of FIG. 4 indicates a depth from the outermost surface of the pad region in nanometer, which is exposed from the opening portion 105 after the plasma processing. The vertical axis of FIG. 4 indicates a distribution of a content ratio of each element in a depth direction of the pad region in percentage.

A surface abnormal layer containing Si, N, and O at high ratios is observed in the range of about 10 nm in the depth direction from the outermost surface of the pad region. This surface abnormal layer corresponds to the film 106 formed on the aluminum alloy wiring 102. C and F that are contained in the surface abnormal layer are inevitable impurities occurring in accordance with the implementation environment, and have no influence on the present invention.

Comparative Example 1

Figure 5:
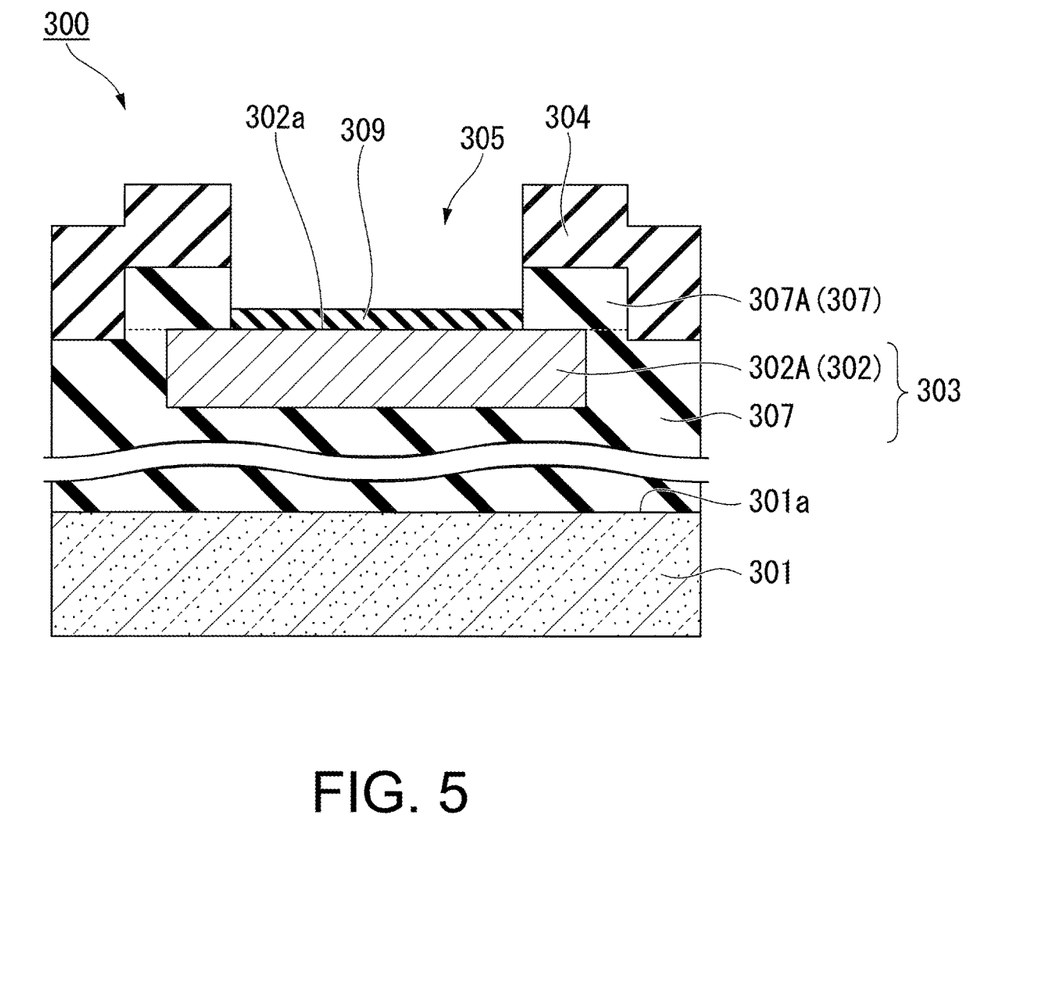
FIG. 5 is a cross-sectional view of a semiconductor device according to Comparative Example 1 of the present invention.

As Comparative Example 1 of the present invention, a composition analysis of the pad region from an outermost surface thereof in a thickness direction of the pad region was performed with use of a sample of a semiconductor device 300 having the related-art structure as illustrated in FIG. 5.

Similarly to Example 1, on an aluminum alloy wiring 302 being an uppermost layer, a $SiO_2$ film 307A and a SiN film 304 were formed in the stated order so as to have a thickness of 2,000 Å and a thickness of 7,000 Å, respectively, and then a pad opening was formed. However, the plasma processing was not performed with respect to the SiN film 304 after the pad opening was formed.

Figure 6:
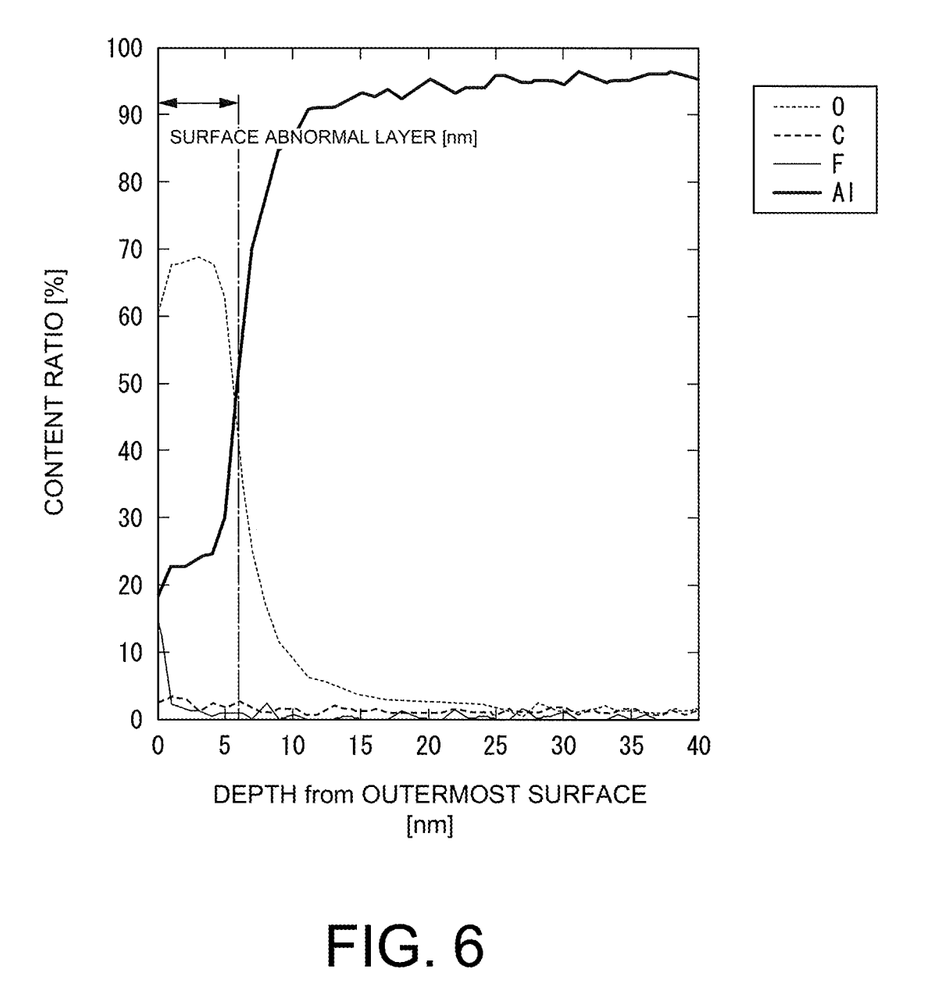
FIG. 6 is a graph for showing a composition analysis result of a pad surface portion of the semiconductor device of Comparative Example 1 of the present invention.

FIG. 6 is a graph for showing a composition analysis result. The horizontal axis and the vertical axis of FIG. 6 indicate the same as those of FIG. 4. It can be understood that an oxide film made of alumina ($Al_2O_3$) is formed in a range of about 6.3 nm in the depth direction of the pad region from the outermost surface after the plasma processing. This oxide film is a natural oxide film formed on an exposed portion of the surface 302a of the aluminum alloy wiring 302 through exposure to the air.

[Relationship Between Plasma Processing Time and Film Formed on Pad Surface]

With use of the sample of Example 1, a relationship between the plasma processing time after the pad opening was formed and a pad surface state after the plasma processing was examined.

Figure 7:
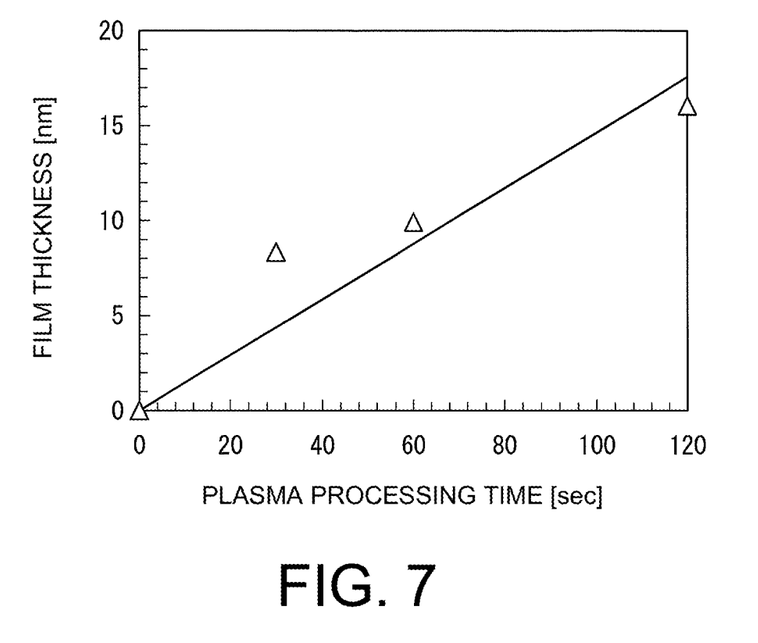
FIG. 7 is a graph for showing a relationship between plasma processing time and a thickness of a film that is formed on a pad in the semiconductor device of Example 1 of the present invention.

FIG. 7 is a graph for showing a relationship between the plasma processing time and a thickness of a film formed on the pad portion. The horizontal axis of FIG. 7 indicates the plasma processing time in second. The vertical axis of FIG. 7 indicates a thickness of the film formed on the pad portion in nanometer. From the graph of FIG. 7, it can be understood that the film formed on the pad portion is a film formed by performing the plasma processing, and its thickness changes in proportion to the plasma processing time.

[Relationship Between Dicing Time and Pad Surface State]

Figure 8:
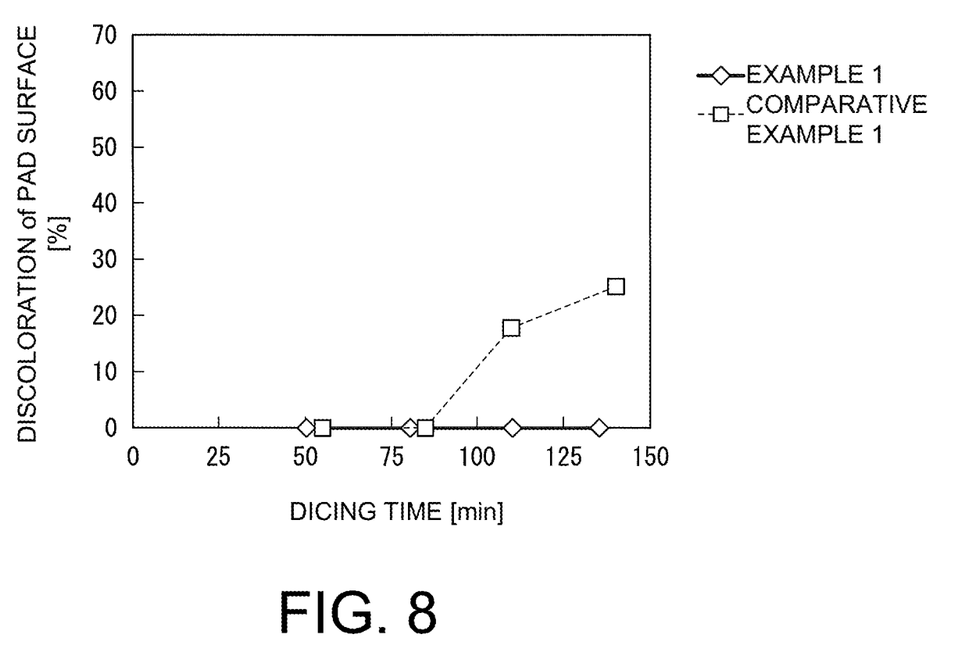
FIG. 8 is a graph for showing a relationship between dicing time and a degree of discoloration of a pad surface in the semiconductor device of Example 1 and Comparative Example 1 of the present invention.

At a predetermined position of the samples of Example 1 and Comparative Example 1, the state of the pad surface was observed after blade dicing was performed. FIG. 8 is a graph for showing a relationship between dicing time and a degree of discoloration of the pad surface caused by the dicing. The horizontal axis of FIG. 8 indicates the dicing time in minute. The vertical axis of FIG. 8 indicates the degree of discoloration of the pad surface in percentage.

In the sample of Example 1 (plotted by diamonds), the degree of discoloration of the pad surface remains at 0% irrespective of the dicing time. Accordingly, it can be understood that occurrence of the galvanic corrosion is suppressed. In contrast, in the sample of Comparative Example 1 (plotted by squares), it can be understood that the degree of discoloration of the pad surface increases as the dicing time becomes longer.

Figure 9A:
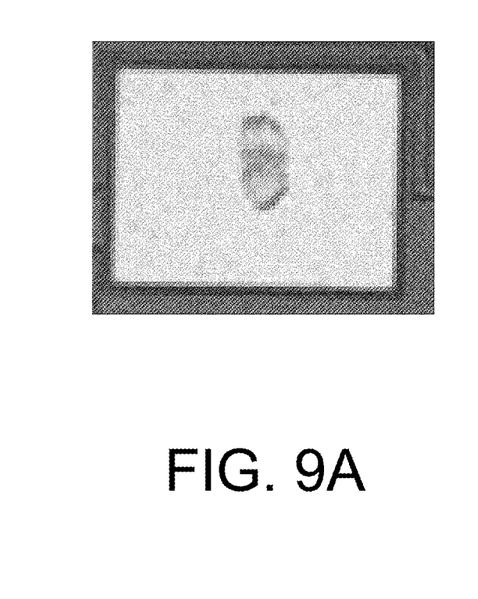
FIG. 9A, FIG. 9B, and FIG. 9C are images for showing a relationship between the dicing time and a pad surface state in the semiconductor device of Example 1 of the present invention.
Figure 9B:
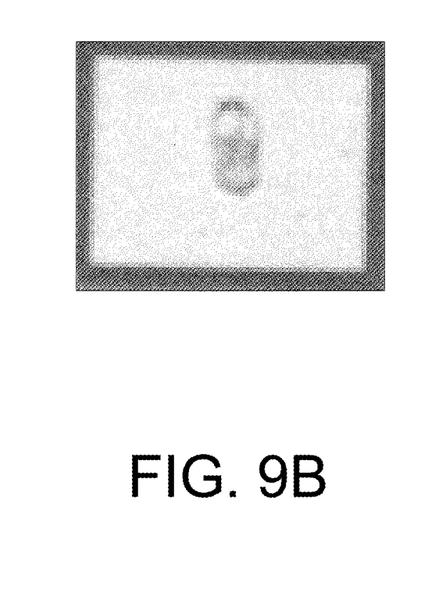
Figure 9C:
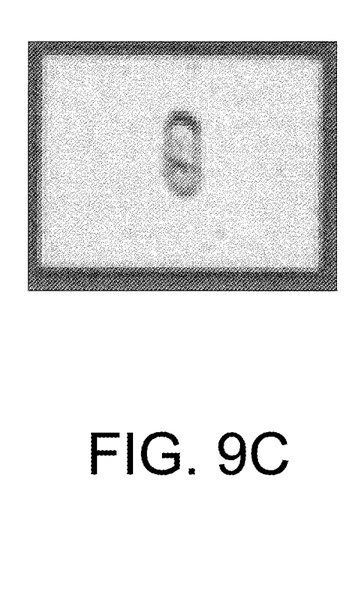

The states of the pad surface in the case in which the dicing time was set to 55 minutes, 85 minutes, and 140 minutes with respect to the sample of Example 1 are shown in FIG. 9A to 9C, respectively. The state of the pad surface is good in any of FIG. 9A to 9C, and no change depending on the dicing time can be observed. From those results, it is assumed that the bonding strength can be maintained in the sample of Example 1 because a defect in the aluminum alloy wiring due to the galvanic corrosion does not occur even when the blade dicing is performed.

Figure 10A:
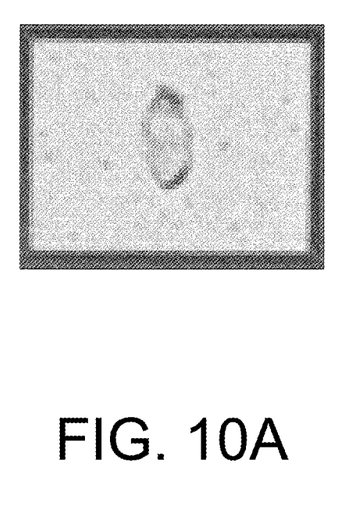
FIG. 10A, FIG. 10B, and FIG. 10C are images for showing a relationship between the dicing time and a pad surface state in the semiconductor device of Comparative Example 1 of the present invention.
Figure 10B:
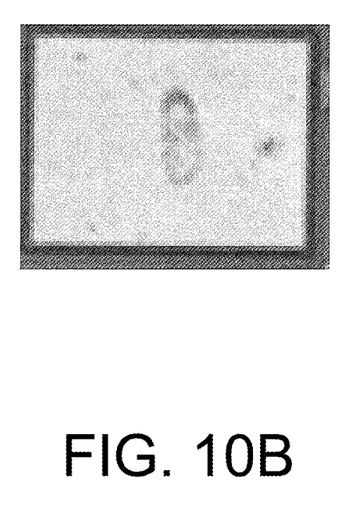
Figure 10C:
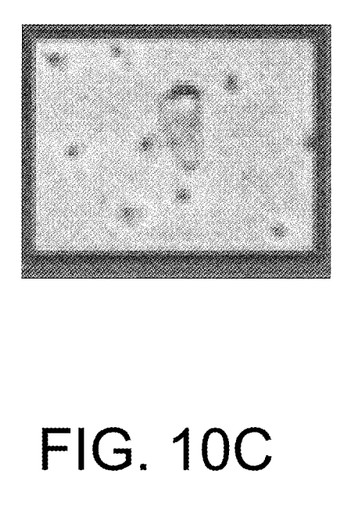

The states of the pad surface in the case in which the dicing time was set to 55 minutes, 85 minutes, and 140 minutes with respect to the sample of Comparative Example 1 are shown in FIG. 10A to 10C, respectively. In comparison with FIG. 9A to 9C, the pad surface is discolored in any of FIG. 10A to 10C, and as the dicing time becomes longer, the degree of discoloration increases. From those results, it is assumed that deterioration of the bonding strength due to a defect in the aluminum alloy wiring cannot be avoided in the sample of Comparative Example 1 because the galvanic corrosion occurs on the pad surface as the dicing proceeds and the galvanic corrosion further progresses as the dicing time becomes longer.

[Relationship Between Dicing Time and Shear Strength]

Figure 11:
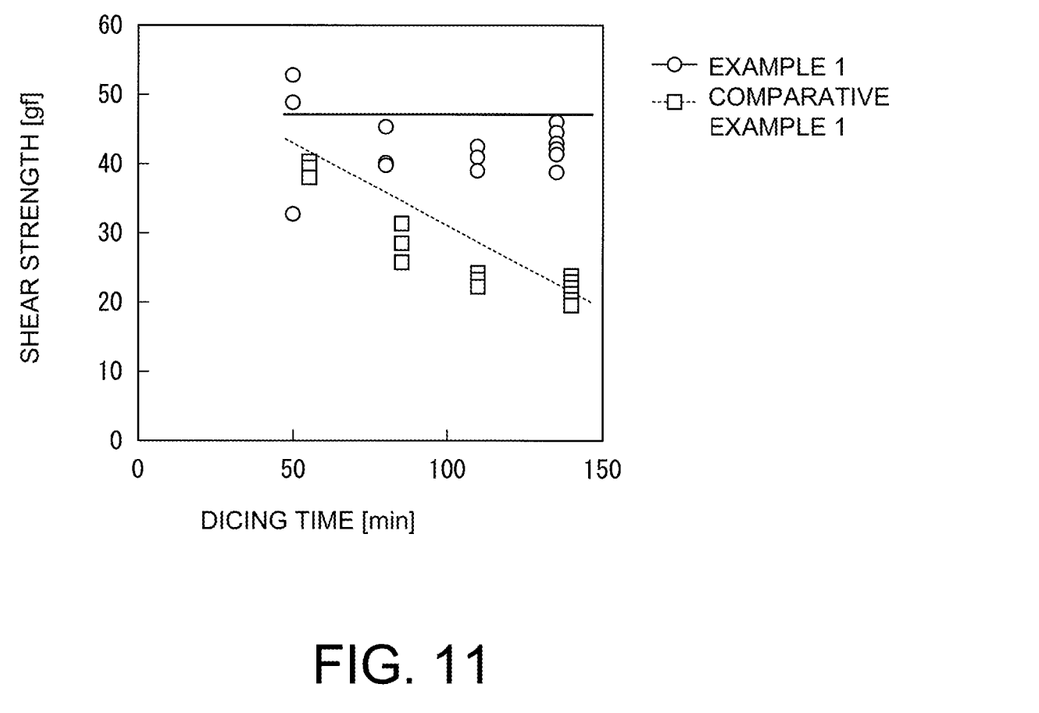
FIG. 11 is a graph for showing a relationship between the dicing time and shear strength in the semiconductor device of Example 1 and Comparative Example 1 of the present invention.

At a predetermined position of the samples of Example 1 and Comparative Example 1, wire bonding was performed with respect to the pad portion after blade dicing was performed. FIG. 11 is a graph for showing a relationship between blade dicing time and shear strength (bonding strength) of a wire bonding portion. The horizontal axis of FIG. 11 indicates the dicing time in minute, and the vertical axis of FIG. 11 indicates the shear strength in gram-force.

In the sample of Example 1, certain shear strength is maintained irrespective of the dicing time. In contrast, in the sample of Comparative Example 1, as the dicing time becomes longer, the shear strength deteriorates. From those results, it can be found that the above-mentioned assumptions based on the results of FIG. 8 to FIG. 10C are correct.

What is claimed is:

1. A semiconductor device, comprising:
    a substrate;
    a laminate on one main surface side of the substrate, and including an aluminum alloy wiring and an insulating film surrounding the aluminum alloy wiring;
    a silicon nitride film covering the laminate;
    an opening through the silicon nitride film and the insulating film having a substantially constant size, and exposing a pad portion of the aluminum alloy wiring; and
    a reverse-sputtered deposition residue containing silicon and nitrogen, the residue comprising a film adhering to a surface of the pad portion.

2. A semiconductor device according to claim 1, wherein the film contains silicon in a ratio of 50% to 70% and nitrogen in a ratio of 5% to 25%.

3. A semiconductor device according to claim 1, wherein the film further contains oxygen.

4. A semiconductor device according to claim 2, wherein the film further contains oxygen.

5. A semiconductor device according to claim 1, wherein the film is also formed on an inner wall of the opening portion.

6. A semiconductor device according to claim 2, wherein the film is also formed on an inner wall of the opening portion.

7. A semiconductor device according to claim 1, wherein a titanium nitride film resides in a peripheral portion of the inner sidewall of the opening at the surface of the aluminum alloy wiring.

8. A semiconductor device according to claim 1, wherein the film has a thickness of 100 Å to 200 Å.

9. A semiconductor device according to claim 2, wherein the film has a thickness of 100 Å to 200 Å.

10. A method of manufacturing the semiconductor device of claim 1, comprising performing plasma processing using inert gas with respect to the silicon nitride film after the opening portion is formed.

11. A method of manufacturing the semiconductor device of claim 2, comprising performing plasma processing using inert gas with respect to the silicon nitride film after the opening portion is formed.

12. A method of manufacturing the semiconductor device of claim 3, comprising performing plasma processing using inert gas with respect to the silicon nitride film after the opening portion is formed.

13. A method of manufacturing the semiconductor device of claim 5, comprising performing plasma processing using inert gas with respect to the silicon nitride film after the opening portion is formed.

14. A method of manufacturing the semiconductor device of claim 7, comprising performing plasma processing using inert gas with respect to the silicon nitride film after the opening portion is formed.

15. A method of manufacturing the semiconductor device of claim 8, comprising performing plasma processing using inert gas with respect to the silicon nitride film after the opening portion is formed.

16. A method of manufacturing the semiconductor device according to claim 10, wherein argon gas is used as the inert gas.

17. A method of manufacturing the semiconductor device according to claim 10, wherein time for the plasma processing is set to 30 seconds or more and 120 seconds or less.

* * * * *

UNITED STATES PATENT AND TRADEMARK OFFICE
CERTIFICATE OF CORRECTION

PATENT NO. : 10,586,776 B2
APPLICATION NO. : 15/906477
DATED : March 10, 2020
INVENTOR(S) : Yoichi Mimuro et al.

It is certified that error appears in the above-identified patent and that said Letters Patent is hereby corrected as shown below:

On the Title Page

Item (*) Notice, delete "This patent is subject to a terminal disclaimer.".

In the Claims

In Column 8, Claim 5, Line 67, delete "portion".

In Column 9, Claim 6, Line 3, delete "portion".

In Column 9, Claim 10, Line 15, delete "portion".

In Column 9, Claim 11, Line 19, delete "portion".

In Column 9, Claim 12, Line 23, delete "portion".

In Column 10, Claim 13, Line 4, delete "portion".

In Column 10, Claim 14, Line 8, delete "portion".

In Column 10, Claim 15, Line 12, delete "portion".

Signed and Sealed this
Sixteenth Day of June, 2020

Andrei Iancu
*Director of the United States Patent and Trademark Office*